United States Patent
Machnicki et al.

(10) Patent No.: US 8,310,291 B2
(45) Date of Patent: Nov. 13, 2012

(54) DLL HAVING A DIFFERENT TRAINING INTERVAL DURING A VOLTAGE CHANGE

(75) Inventors: Erik P. Machnicki, San Jose, CA (US); James D. Ramsay, San Jose, CA (US); Sanjay Mansingh, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 104 days.

(21) Appl. No.: 12/948,192

(22) Filed: Nov. 17, 2010

(65) Prior Publication Data

US 2012/0119803 A1    May 17, 2012

(51) Int. Cl.
*H03L 7/06* (2006.01)
(52) U.S. Cl. .......... 327/158; 327/156; 327/161
(58) Field of Classification Search .......... 327/156, 327/158, 161
See application file for complete search history.

(56) References Cited

U.S. PATENT DOCUMENTS

| | | | |
|---|---|---|---|
| 6,100,735 | A | 8/2000 | Lu |
| 7,202,719 | B2 | 4/2007 | Gabato et al. |
| 7,639,054 | B1 | 12/2009 | Burney |
| 2003/0100283 | A1 | 5/2003 | Wu et al. |
| 2007/0097758 | A1* | 5/2007 | Lee .................. 365/189.09 |
| 2008/0080647 | A1 | 4/2008 | Altmann et al. |

* cited by examiner

*Primary Examiner* — John Poos
(74) *Attorney, Agent, or Firm* — Lawrence J. Merkel; Stephen J. Curran; Meyertons, Hood, Kivlin, Kowert & Goetzel, P.C.

(57) ABSTRACT

A delay locked loop (DLL) having an accelerated training interval during a voltage change. An integrated circuit (IC) includes a master DLL configured to generate a clock signal based upon a reference clock signal. The master DLL may train to the reference clock signal in response to a control signal. The IC also includes a control unit that is coupled to the master DLL and may provide the control signal at a first interval in response to receiving an indication that a supply voltage is being changed, and provide the control signal at a second interval in the absence of the indication.

20 Claims, 3 Drawing Sheets

DLL HAVING A DIFFERENT TRAINING INTERVAL DURING A VOLTAGE CHANGE

BACKGROUND

1. Technical Field

This disclosure relates to delay locked loops (DLLs) and more particularly to a DLL training protocol during a change in operating voltage.

2. Description of the Related Art

Many types of devices use delay locked loops (DLLs). Typically, a DLL is used to establish and maintain a particular phase relationship with a reference clock or other signal and to provide one or more delayed versions of that reference signal. When a DLL is first powered up, the DLL may enter a training mode to acquire and lock onto the reference signal edge. In addition, in many DLLs the delay line may be set up to provide the required amount of delay for the intended application. Depending on various circuit parameters such as the particular application, the operating environment, and the like, a conventional DLL may need to be retrained at some predetermined interval to accommodate drift, etc.

Generally, the parameters that affect the delay of the DLL may change slowly, and so a conventional DLL may have a long period between retraining to save power. However, certain parameters such as operating voltage changes, for example, may cause the delay values of the DLL to change rapidly with the change in voltage and thus the long interval between retraining may be inadequate. On the other hand, retraining the DLL more frequently can be problematic because retraining the DLL consumes considerably more power than normal DLL operation, and in mobile applications power consumption is an important consideration.

SUMMARY

Various embodiments of a delay locked loop (DLL) having an accelerated training interval during a voltage change. In one embodiment, an integrated circuit (IC) includes a master DLL configured to generate a clock signal based upon a reference clock signal. The master DLL may be configured to train to the reference clock signal in response to a control signal. The IC also includes a control unit that is coupled to the master DLL and may be configured to provide the control signal at a first interval in response to receiving an indication that a supply voltage is being changed, and to provide the control signal at a second interval in the absence of the indication. In one implementation, the first interval is shorter than the second interval.

Figure 1:
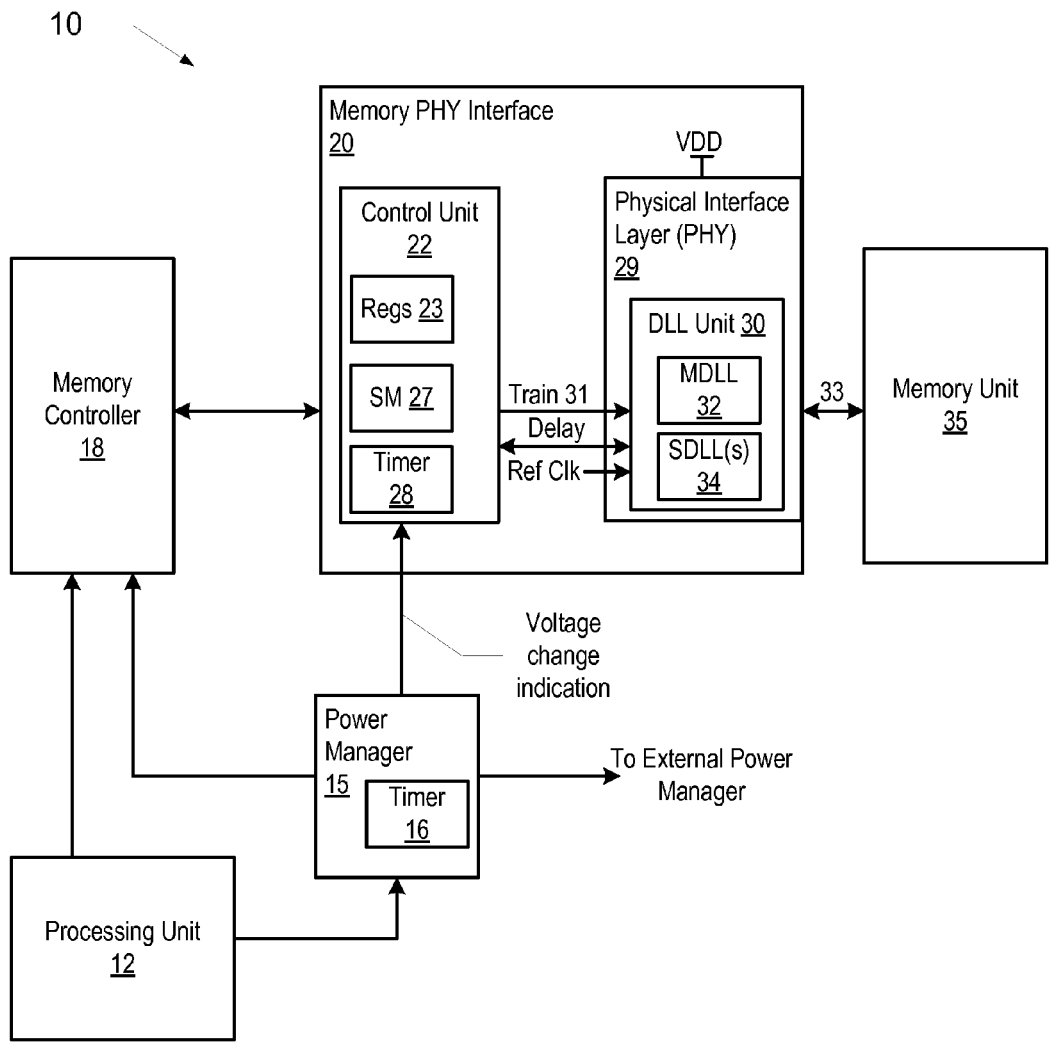
FIG. 1 is a block diagram of one embodiment of an integrated circuit including a memory interface having a DLL control unit.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of an integrated circuit including a memory interface having a DLL control unit is shown. The integrated circuit 10 includes a processing unit 12 that is coupled to a power manager 15 and to a memory controller 18. The power manager 15 and the memory controller 18 are also each coupled to the memory PHY interface 20, which is in turn coupled to a memory unit 35 via a memory interconnect 33. In one embodiment, the integrated circuit 10 may be considered as a system on a chip (SOC).

In various embodiments, the processing unit 12 may include one or more processor cores and one or more cache memories (not shown). The processor cores may execute application software as well as operating system (OS) software. The OS may control various features and functions of the integrated circuit.

The memory unit 35 may be representative of any type of memory. In one embodiment, the memory device 35 may be representative of one or more random access memory (RAM) memory devices in the dynamic RAM (DRAM) family of devices as described below in conjunction with the description of FIG. 3.

As shown in FIG. 1, the memory PHY interface 20 includes a control unit 22 that is coupled to a physical interface layer (PHY) unit 29. The PHY 29 includes a delay locked loop (DLL) unit 30. In one embodiment, the DLL unit 30 includes a master DLL 32 that is configured to acquire and lock onto a particular edge of the reference clock (Ref Clk), and one or more slave DLLs 34 that are configured to provide one or more delayed versions of Ref Clk for use by the memory interconnect 33.

In one embodiment, the control unit 22 may be configured to control the operation of DLL unit 30 through the use of registers 23, a state machine 27, and a timer unit 28. During operation, control unit 22 may provide a train signal 31 to the DLL unit 30 at predetermined intervals. The train signal 31 causes the DLL unit 30 to initiate and execute a training cycle, during which, the master DLL 32 may acquire and lock onto the Ref Clk signal and provide a lock value to the control unit 22. In addition, the control unit 22 may reconfigure the delay line elements of the slave DLLs with new delay values. In one embodiment, the master DLL 32 may be configured to power down upon completion of the training cycle, while the slave DLLs 34 may continue to operate.

The state machine 26 keeps track of the state of the DLL unit 30. As mentioned above, during normal operation, the control unit 22 may assert the train signal 31 at a predetermined interval so that the DLL unit 30 may compensate for drift due for example, to temperature variations of the integrated circuit 10. Accordingly, the timer unit 28 may include one or more counters that determine the period of time between training (i.e., the training interval). Since the variations associated with normal operations occur relatively slowly, in one embodiment the timer 28 may use a first counter that may count up or down to determine and provide the normal training interval. In one embodiment the normal training interval may be on the order of a few milliseconds. Thus, every few milliseconds, for example, the control unit 22 may assert the train signal 31. However, it is noted that in other embodiments the training interval may be shorter or longer as desired.

During a voltage change event, the supply voltage may change quickly, and the delays of the elements in the delay line may change quickly in response, thereby possibly causing improper operation of the memory interconnect 33. Accordingly, in response to receiving a voltage change indication from the power manager 15, the control unit 22 may be configured to cause the DLL unit 30 to retrain at a different and accelerated training interval. The accelerated training interval that may be fast enough to allow the master DLL 32 to track the Ref Clk signal and allow new delay values that correspond to the number of delay elements to be loaded into the slave DLLs 34. More particularly, in one embodiment, the timer unit 28 may also include a second counter that may count up or down to determine and provide a second training interval or "voltage slew training" that is faster (i.e., more frequent) than the normal training interval. In such an embodiment, the accelerated voltage slew training interval may be on the order of a few microseconds, although in other embodiments the voltage slew training interval may be longer or shorter as desired. In one embodiment, to ensure that the DLL unit 30 has retrained all the way through the voltage change, the control unit 22 may continue providing the train signal 31 at the accelerated voltage slew training interval as long as the voltage change indication is present and/or asserted. It is noted that an asserted signal refers to a signal that transitions to its active state. More particularly, if a signal is an active low signal, then it is considered to be asserted when the signal level is at a logic low level. Conversely, if a signal is an active high signal, then it is considered to be asserted when the signal level is at a logic high level.

Upon removal or deassertion of the voltage change indication the control unit 22 may transition back to the normal state, and begin asserting the train signal 31 at the normal training interval. It is noted that each of the counters within timer unit 28 may be programmed to any length interval via the registers 23 within control unit 22. It is further noted that instead of the timer unit 28 including two separate counters, it is contemplated that the timer unit may include a single counter within which a new value is loaded when the state changes from normal training mode to accelerated training mode and back to normal training mode again.

In one embodiment, the OS may determine when a voltage change is required, and send a corresponding command to the power manager 15 to initiate the voltage change. The OS may also calculate how long each voltage change will take based upon factors such as the slew rate of the power supply, and the voltage difference between the current voltage and the new voltage, for example. In addition, the power manager 15 includes a programmable timer 16 that determines how long the voltage change indication stays asserted. Accordingly, the OS may program the timer 16 with a value that corresponds to the time it will take the power supply to ramp to the new voltage. In one embodiment, the OS may send the value each time it sends a new voltage change command to the power manager 15. In this way, power consumption may be reduced by requiring the control unit 22 to have the DLL unit 30 retraining using the accelerated training interval for only as long as is necessary.

Figure 2:
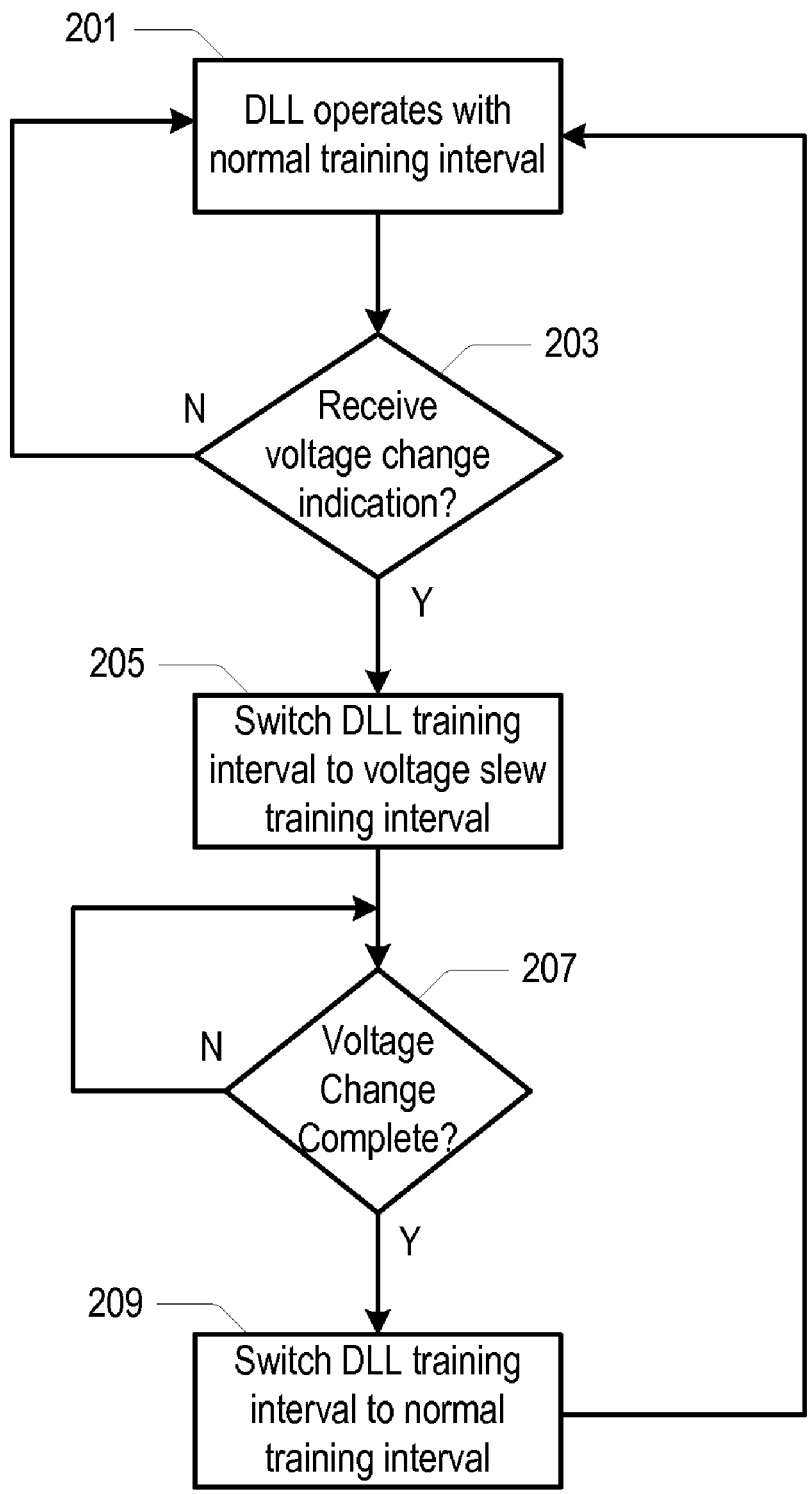
FIG. 2 is a flow diagram describing operational aspects of the memory interface shown in FIG. 1.

Referring to FIG. 2, a flow diagram describing operational aspects of the memory interface of FIG. 1 is shown. Referring collectively to FIG. 1 and FIG. 2 and beginning in block 201 of FIG. 2, during normal operation the control unit 22 may be configured to send the train signal 31 to the DLL unit 30 at a normal training interval as determined by the timer unit 28 as described above. More particularly, as described above, to save power the master DLL 32 may be trained infrequently during normal operation. Thus, if the control unit 28 has not received or detected a voltage change indication (block 203), the control unit 22 will continue to train the master DLL 32 at the normal training interval.

However, in response to receiving the voltage change indication or detecting an assertion of the voltage change indication signal (block 203), the control unit 22 is configured change state to the accelerated voltage slew training interval mode and to switch to the voltage slew training interval as described above (block 205). Accordingly, the control unit 22 may be configured to send the train signal 31 to the master DLL 32 more frequently as determined by timer unit 28. The control unit 22 will continue to stay in the accelerated voltage slew training interval mode as long as the voltage change indication is asserted (block 207). When the control unit 22 detects that the voltage change indication signal has been deasserted or that the voltage change indication signal is no longer present indicating that the voltage change is complete, the control unit 22 may transition back to the normal mode state. Thus, the control unit 22 may begin sending the train signal at the normal training mode interval as determined by the timer unit 28 (block 209).

Figure 3:
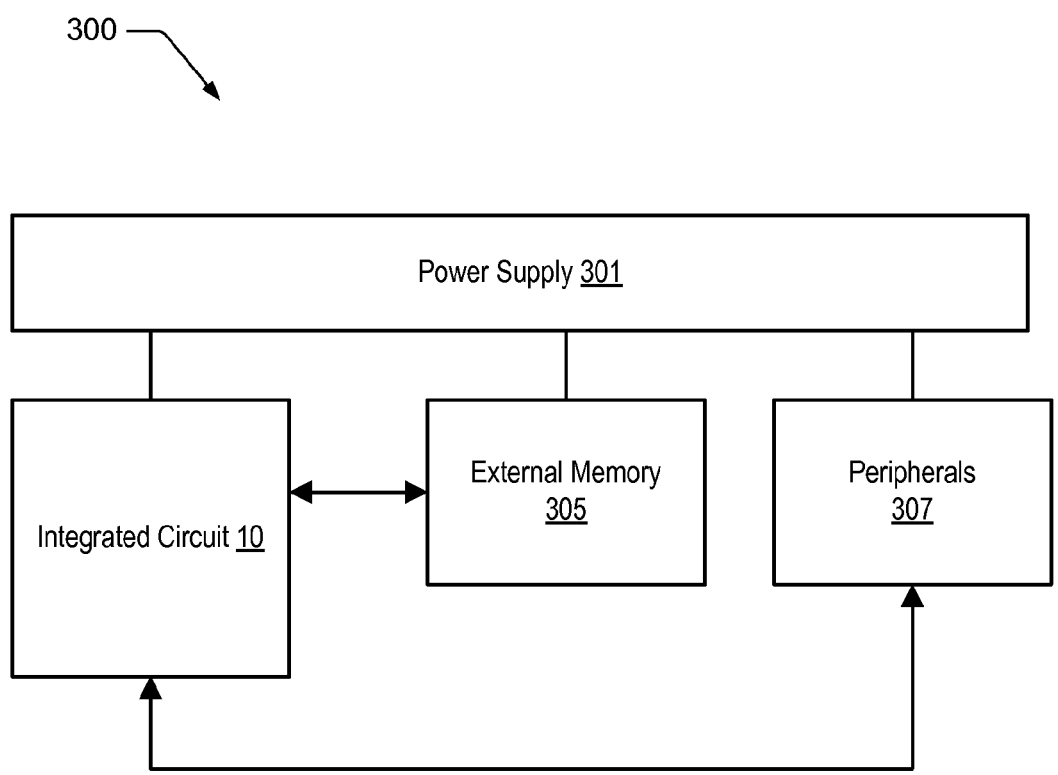
FIG. 3 is a block diagram of one embodiment of a system that includes the memory interface of FIG. 1.

Turning to FIG. 3, a block diagram of one embodiment of a system that includes the integrated circuit 10 is shown. The system 300 includes at least one instance of the integrated circuit 10 of FIG. 1 coupled to one or more peripherals 307 and a system memory 305. The system 300 also includes a power supply 301 that may provide one or more supply voltages to the integrated circuit 10 as well as one or more supply voltages to the memory 305 and/or the peripherals 307. In some embodiments, more than one instance of the integrated circuit 10 may be included.

The peripherals 307 may include any desired circuitry, depending on the type of system. For example, in one embodiment, the system 300 may be included in a mobile device (e.g., personal digital assistant (PDA), smart phone, etc.) and the peripherals 307 may include devices for various types of wireless communication, such as WiFi, Bluetooth, cellular, global positioning system, etc. The peripherals 307 may also include additional storage, including RAM storage, solid-state storage, or disk storage. The peripherals 307 may include user interface devices such as a display screen, including touch display screens or multitouch display screens, keyboard or other input devices, microphones, speakers, etc. In other embodiments, the system 300 may be included in any type of computing system (e.g. desktop personal computer, laptop, workstation, net top etc.).

The system memory 305 may include any type of memory. For example, as described above in conjunction with FIG. 1, the system memory 305 may be in the DRAM family such as synchronous DRAM (SDRAM), double data rate (DDR, DDR2, DDR3, etc.), or any low power version thereof. However, system memory 305 may also be implemented in SDRAM, static RAM (SRAM), or other types of RAM, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a master delay locked loop (DLL) configured to generate a clock signal based upon a reference clock signal, wherein the master DLL is configured to train to the reference clock signal in response to a control signal; and
   a control unit coupled to the master DLL and configured to provide the control signal at a first interval in response to receiving an indication that a supply voltage is being changed, and to provide the control signal at a second interval in the absence of the indication.

2. The integrated circuit as recited in claim 1, wherein the first interval is shorter than the second interval.

3. The integrated circuit as recited in claim 1, wherein during training the master DLL is configured to acquire and lock onto a given edge of the reference clock signal and to provide a delay value to the control unit for use by one or more slave DLLs.

4. The integrated circuit as recited in claim 1, wherein the control unit includes a timer unit configured to provide the first interval and the second interval.

5. The integrated circuit as recited in claim 4, wherein the timer unit includes a first programmable counter configured to generate the first interval and a second programmable counter configured to generate the second interval.

6. An integrated circuit comprising:
   a delay locked loop (DLL) configured to generate a clock signal based upon a reference clock signal, wherein the DLL is configured to train to the reference clock signal at a training interval that is dependent upon a control signal; and
   a control unit coupled to the DLL and configured to provide the control signal at an accelerated training interval in response to receiving an indication that a supply voltage is being changed.

7. The integrated circuit as recited in claim 6, wherein the control unit is configured to provide the control signal at a normal training interval in the absence of the indication.

8. The integrated circuit as recited in claim 7, wherein the accelerated training interval is shorter than the normal training interval.

9. The integrated circuit as recited in claim 6, wherein during training the DLL is configured to acquire and lock onto a given edge of the reference clock signal and to provide a delay value to the control unit for use by one or more slave DLLs.

10. The integrated circuit as recited in claim 6, wherein the control unit includes a timer unit configured to generate the accelerated training interval and the normal training interval.

11. The integrated circuit as recited in claim 10, wherein the timer unit includes a programmable counter, wherein the control unit is configured to load a first count value into the programmable counter to generate the normal training interval and to load a second value into the programmable counter to generate the accelerated training interval.

12. The integrated circuit as recited in claim 10, wherein the timer unit includes a first programmable counter configured to generate the normal training interval and a second programmable counter configured to generate the accelerated training interval.

13. A method comprising:
    training a delay locked loop (DLL) to a reference clock signal at a training interval that is dependent upon a control signal; and
    a control unit providing the control signal at an accelerated training interval in response to receiving an indication that a supply voltage is being changed, and providing the control signal at a normal training interval in the absence of the indication.

14. The method as recited in claim 13, wherein the accelerated training interval is shorter than the normal training interval.

15. The method as recited in claim 13, further comprising the control unit loading a first value into a counter and generating the accelerated training interval, and the control unit loading a second value into the counter and generating the normal training interval.

16. The method as recited in claim 13, further comprising the control unit loading a first value into a first programmable counter and generating the normal training interval, and the control unit loading a second value into a second programmable counter and generating the accelerated training interval.

17. A mobile communications device comprising:
    a memory device; and
    an integrated circuit coupled to the memory device, wherein the integrated circuit includes:
      a master delay locked loop (DLL) configured to generate a clock signal based upon a reference clock signal, wherein the master DLL is configured to train to the reference clock signal in response to a control signal; and
      a control unit coupled to the master DLL and configured to provide the control signal at an accelerated training interval in response to receiving an indication that a supply voltage is being changed, and to provide the control signal at a normal training interval in the absence of the indication.

18. The mobile device as recited in claim 17, wherein a time period associated with the accelerated training interval is shorter than a time period associated with the normal training interval.

19. The mobile device as recited in claim 17, wherein the integrated circuit includes a timer unit configured to generate the accelerated training interval and the normal training interval.

20. The mobile device as recited in claim 17, wherein the integrated circuit includes a power management unit including a programmable timer that determines the time period that the indication that a supply voltage is being changed is asserted.

* * * * *